United States Patent
Shioi

(10) Patent No.: US 8,153,023 B2
(45) Date of Patent: Apr. 10, 2012

(54) PHOSPHOR, METHOD FOR PRODUCTION THEREOF, AND LIGHT-EMITTING APPARATUS

(75) Inventor: Kousuke Shioi, Chiba (JP)

(73) Assignee: Showa Denko K.K., Tokyo (JP)

( * ) Notice: Subject to any disclaimer, the term of this patent is extended or adjusted under 35 U.S.C. 154(b) by 460 days.

(21) Appl. No.: 12/307,641

(22) PCT Filed: Jul. 11, 2007

(86) PCT No.: PCT/JP2007/064122
§ 371 (c)(1),
(2), (4) Date: Feb. 2, 2009

(87) PCT Pub. No.: WO2008/010498
PCT Pub. Date: Jan. 24, 2008

(65) Prior Publication Data
US 2009/0251044 A1 Oct. 8, 2009

(30) Foreign Application Priority Data
Jul. 18, 2006 (JP) .................. 2006-195415

(51) Int. Cl.
C09K 11/64 (2006.01)
C09K 11/08 (2006.01)
C09K 11/80 (2006.01)
H01L 33/00 (2010.01)
H05B 33/14 (2006.01)

(52) U.S. Cl. ............... 252/301.4 F; 257/98; 313/503; 313/486

(58) Field of Classification Search ........... 252/301.4 F; 313/503, 486; 257/98
See application file for complete search history.

(56) References Cited

U.S. PATENT DOCUMENTS

| | | | |
|---|---|---|---|
| 6,674,233 B2 | | 1/2004 | Ellens et al. |
| 7,474,050 B2 * | | 1/2009 | Kaneda et al. ............. 313/504 |
| 2003/0030368 A1 * | | 2/2003 | Ellens et al. ............. 313/503 |
| 2004/0155225 A1 * | | 8/2004 | Yamada et al. ......... 252/301.4 R |
| 2005/0230689 A1 | | 10/2005 | Setlur et al. |
| 2007/0248519 A1 * | | 10/2007 | Mitomo et al. ............ 423/263 |

FOREIGN PATENT DOCUMENTS

| | | | |
|---|---|---|---|
| JP | 2002-203991 A | | 7/2002 |
| JP | 2003-203504 A | | 7/2003 |
| JP | 2004-067837 A | | 3/2004 |
| JP | 2004-186278 A | | 7/2004 |
| JP | 3668770 B2 | | 4/2005 |
| JP | 2005-154611 | * | 6/2005 |
| JP | 2005-154611 A | | 6/2005 |
| JP | 2006-124675 A | | 5/2006 |
| JP | 2006-137902 | * | 6/2006 |
| JP | 2006-137902 A | | 6/2006 |
| WO | WO 2006/011317 | * | 2/2006 |
| WO | 2006/061778 A1 | | 6/2006 |
| WO | WO 2006/003930 | * | 12/2006 |

OTHER PUBLICATIONS

Takashi Mukai, et al.; "White and Ultraviolet LED"; vol. 68; No. 2 (1999); pp. 152-155.
Chinese Office Action mailed Nov. 15, 2011 for counterpart Chinese Application No. 200780027166.0.

* cited by examiner

*Primary Examiner* — Carol M Koslow
(74) *Attorney, Agent, or Firm* — Sughrue Mion, PLLC

(57) ABSTRACT

A phosphor represented by $M1_{(x1)}M2_{(x2)}M3_{12}(O,N)_{16}$, wherein M1 denotes one or more metal elements selected from Li, Mg, Ca, Sr, Ba, Y, La, Gd and Lu, M2 denotes one or more metal elements selected from Ce, Pr, Eu, Tb, Yb and Er, M3 denotes one or more metal elements selected from Si, Ge, Sn, B, Al, Ga and In, and x1 and x2 satisfy $0<x1, x2<2$ and $0<x1+x2<2$. The phosphor may be an α-sialon-based phosphor containing at least one of Sr and Ba in an amount of 5 mass % or less. The respective phosphors are manufactured by a method that includes firing a raw material mixture of the phosphor in a nonoxidizing atmosphere at 1600 to 2200° C. A light-emitting apparatus is made possible by combining the respective phosphors with a light-emitting device.

15 Claims, No Drawings

US 8,153,023 B2

PHOSPHOR, METHOD FOR PRODUCTION THEREOF, AND LIGHT-EMITTING APPARATUS

CROSS REFERENCE TO RELATED APPLICATIONS

This application is a 371 of PCT/JP2007/064122 filed Jul. 11, 2007 and which claims priority from Japanese Patent Application No. 2006-195415 filed Jul. 18, 2006, incorporated herein by reference in its entirety.

TECHNICAL FIELD

This invention relates to an oxynitride-based phosphor optically activated with a rare-earth element. More particularly, this invention relates to a phosphor that is capable of imparting increased luminance to a white light-emitting diode (white LED) having a blue light-emitting diode (blue LED) or an ultraviolet light-emitting diode (ultraviolet LED) as a light source or realizing while electroluminescence (EL) having inorganic EL as a light source and to a white LED using the phosphor.

BACKGROUND ART

The light-emitting diode (LED) is a solid-state semiconductor light-emitting device resulting from joining a p-type semiconductor and an n-type semiconductor. Since the LED possesses strong points, such as long service life, excellent crashworthiness, low electric power consumption and high reliability, and as well enables decreasing size, thickness and weight thereof, it has been coming into use as light sources for various apparatus. Particularly, the white LED has been coming into use as disaster prevention lighting fixtures requiring reliability, in-vehicle lighting fixtures and liquid crystal backlights favoring decreases of size and weight, and railroad information boards for displaying train destinations necessitating visual recognition. It is also expected to find application to general household interior illuminations.

When the electric current is passed in the forward direction through the p-n junction formed of a direct transition semiconductor, the resultant recombination of electrons and holes causes the p-n junction to emit light having a peak wavelength conforming to the forbidden bandwidth of the semiconductor. Since the emission spectrum of the LED generally has a narrow half-value width of the peak wavelength, the color of the emission of the white LED is exclusively obtained in accordance with the principle regarding the mixed of colors of lights.

Then, the EL means the emission of light that is induced by the excitation of an electric field. Since the EL lamp emits homogenous light irrespective of the angle of vision and exhibits excellent crashworthiness, it is expected to find growing application to the field of platform panel displays in portable telephones and personal computers and the field of ordinary lighting fixtures characterized by surface emission of light.

Now, by reference to a white LED, a method for deriving a white color from the LED will be described specifically below. Also for the EL, the same method is used.

The known methods include (1) a method that combines three kinds of LEDs emitting a red color (R), a green color (G) and a blue color (B), respectively, and mixes these LED lights, (2) a method that combines an ultraviolet LED emitting an ultraviolet ray and three kinds of phosphors respectively emitting fluorescences of R, G and B in consequence of the excitation by the ultraviolet ray and mixes the fluorescences of the three colors emitted by the phosphors and (3) a method that combines a blue LED emitting a blue light and a phosphor emitting a fluorescence of an yellow color having the relation of an additive complementary color with the blue light in consequence of the excitation by the blue light and mixes the blue LED light and the yellow light emitted from the phosphor.

The method for obtaining a prescribed emission color using a plurality of LEDs necessitates a special circuit adapted to adjust the electric currents of the individual LEDs for the purpose of balancing the different colors. In contrast, the method for obtaining a prescribed emission color combining an LED and a phosphor is at an advantage in obviating the necessity for such a circuit and lowering the cost of the LED. Thus, various proposals have been made heretofore with respect to the phosphors of the kind having an LED as a light source.

For example, the YAG phosphor resulting from doping with Ce a YAG oxide host crystal represented by the composition formula of $(Y, Gd)_3(Al, Ga)_5O_{12}$ has been disclosed (refer to Takashi Mukai et al., Applied Physics, Vol. 68, No. 2 (1999), pp. 152-155). In this document is described the point that the coating of the surface of an InGaN-based blue LED chip with a thin layer of the YAG phosphor results in mixing the blue light emitted from the blue LED and the fluorescence having a peak wavelength of 550 nm and emitted from the YAG phosphor in consequence of the excitation by the blue light and giving rise to a white light.

Further, the white LED resulting from combining a light-emitting device, such as a nitride-based compound semiconductor capable of emitting an ultraviolet ray, and a phosphor emitting light in consequence of the excitation by the ultraviolet ray has been disclosed. As phosphors usable herein, $(Sr, Ca, Ba)_{10}(PO_4)_6Cl_2$:Eu emitting a blue light, $3(Ba, Mg, Mn)0.8Al_2O_3$:Eu a green light and $Y_2O_2S$:Eu a red light are also disclosed (refer to JP-A 2002-203991). An α-sialon-based phosphor has been proposed (refer to Japanese Patent No. 3668770). Here, the α-sialon has Ca or Y incorporated therein in the form of a solid solution.

The YAG-based phosphors are generally at a disadvantage in conspicuously decreasing the spectral intensity when the excited wavelength exceeds the near ultraviolet region.

Then, the white LED obtained by coating the chip surface of the InGaN-based blue LED with a phosphor formed of a YAG-based oxide is reputed to incur difficulty in acquiring high luminance because the excitation energy of the YAG-based oxide which is a phosphor and the excitation energy of the blue LED as the light source do not accord and the excitation energy is not efficiently converted.

Further, when the white LED is formed by combining a light-emitting device, such as the nitride-based compound semiconductor capable of emitting an ultraviolet ray, and the phosphor excited by the ultraviolet ray and enabled to emit light, it is held that this white LED incurs difficulty in acquiring a white color of high luminance on account of the problem that the mixing ratio of the phosphor as the red color component increases because the luminous efficiency thereof is considerably low as compared with the other phosphor.

An object of the invention is to provide a phosphor, with the α-sialon-based phosphor further developed and advanced and provide a light-emitting device using the phosphor, in which the phosphor is capable of imparting increased luminance to a white LED having a blue LED or an ultraviolet LED as a light source or realizing while EL having an EL light-emitting device as a light source.

The present inventor has pursued a diligent study with a view to accomplishing the above object and has perfected this invention consequently.

DISCLOSURE OF THE INVENTION

The present invention provides, as the first aspect thereof, a phosphor represented by $M1_{(x1)}M2_{(x2)}M3_{12}(O,N)_{16}$, wherein M1 denotes one or more metal elements selected from the group consisting of Li, Mg, Ca, Sr, Ba, Y, La, Gd and Lu, M2 one or more metal elements selected from the group consisting of Ce, Pr, Eu, Tb, Yb and Er, M3 one or more metal elements selected from the group consisting of Si, Ge, Sn, B, Al, Ga and In, and x1 and x2 satisfy 0<x1, x2<2 and 0<x1+x2<2.

As the second aspect of the invention, there is provided an α-sialon-based phosphor containing at least one of Sr and Ba in an amount of 5 mass % or less.

In the third aspect of the invention that includes the second aspect, the α-sialon-based phosphor contains Eu.

In the fourth aspect of the invention that includes any one of the first to third aspects, the phosphor has an average particle diameter of is 50 μm or less.

The present invention further provides as the fifth aspect thereof a method for manufacturing the phosphor of the first aspect, comprising firing a raw material mixture of the phosphor in a non-oxidizing atmosphere at 1600 to 2200° C.

In the sixth aspect of the invention that includes the fifth aspect, the firing is effected in a presence of carbon or a carbon-containing compound.

In the seventh aspect of the invention that includes the fifth or sixth aspect, the raw material mixture has added thereto a target phosphor powder synthesized in advance as a seed.

In the eighth aspect of the invention that includes any one of the fifth to seventh aspects, the raw material mixture is packed in advance in a crucible made of alumina, calcia, magnesia, graphite or boron nitride.

In the ninth aspect of the invention that includes the eight aspect, the raw material mixture is packed in advance in an amount of 20 volume % or more of the crucible.

In the tenth aspect of the invention that includes any one of the fifth to ninth aspects, the raw material mixture is a mixture or a double compound selected from the group consisting of metals, silicides, oxides, carbonates, nitrides, oxynitrides, chlorides, fluorides, oxyfluorides, hydroxides, oxalates, sulfates, nitrates, organic metal compounds and compounds enabled by heating to form oxides, nitrides and oxynitrides.

The present invention further provides as the eleventh aspect thereof a method for manufacturing the α-sialon-based phosphor of the second aspect, comprising firing a raw material mixture of the phosphor in a non-oxidizing atmosphere at 1600 to 2200° C.

In the twelfth aspect of the invention that includes the eleventh aspect, the firing is effected in a presence of carbon or a carbon-containing compound.

In the thirteenth aspect of the invention that includes the eleventh or twelfth aspect, the raw material mixture has added thereto a target phosphor powder synthesized in advance as a seed.

In the fourteenth aspect of the invention that includes any one of the eleventh to thirteen aspects, the raw material mixture is packed in advance in a crucible made of alumina, calcia, magnesia, graphite or boron nitride.

In the fifteenth aspect of the invention that includes the fourteenth aspect, the raw material mixture is packed in advance in an amount of 20 volume % or more of the crucible.

In the sixteenth aspect of the invention that includes any one of the eleventh to fifteenth aspects, the raw material mixture is a mixture or a double compound selected from the group consisting of metals, silicides, oxides, carbonates, nitrides, oxynitrides, chlorides, fluorides, oxyfluorides, hydroxides, oxalates, sulfates, nitrates, organic metal compounds and compounds enabled by heating to form oxides, nitrides and oxynitrides.

The present invention further provides as the seventeenth aspect thereof a light-emitting apparatus combining the phosphor of any one of the first to fourth aspects and a light-emitting device.

In the eighteenth aspect of the invention that includes the seventeenth aspect, the light-emitting device is a nitride-based semiconductor light-emitting device and has an emission wavelength of 250 nm to 500 nm.

In the nineteenth aspect of the invention that includes the seventeenth or eighteenth aspect, the light-emitting device is an EL light-emitting device and has an emission wavelength of 250 nm to 500 nm.

Since the phosphor of this invention possesses an absorption band of a wide range extending over ultraviolet to near ultraviolet radiation and over near ultraviolet to visible radiation, it can be effectively applied to the products of the white LED using an ultraviolet LED or a blue LED and the products of the white EL using an EL. Further, since the absorption band is powerful, the phosphor can enhance the luminance of the while LED and the while EL.

BEST MODE FOR CARRYING OUT THE INVENTION

The first version of the phosphor of this invention is a phosphor that is formed of an oxynitride-based compound of the following general formula, based on an α-sialon compound which is an oxynitride-based compound and derived by substituting and enlarging the metal elements thereof:

$M1_{(x1)}M2_{(x2)}M3_{12}(O,N)_{16}$ (wherein M1 denotes one or more metal elements selected from the group consisting of Li, Mg, Ca, Sr, Ba, Y, La, Gd and Lu, M2 one or more metal elements selected from the group consisting of Ce, Pr, Eu, Tb, Yb and Er, M3 one or more metal elements selected from the group consisting of Si, Ge, Sn, B, Al, Ga and In, and x1 and x2 satisfy 0<x1, x2<2 and 0<x1+x2<2).

In the formula, M1 is preferred to be Li, Mg, Ca, Sr and Ba. The elements of M1 contribute to controlling the emission wavelength. A composition containing Li and Mg richly proves favorable when a phosphor has an emission peak more on the short wavelength side and a composition containing Ca richly proves favorable when a phosphor has an emission peak more on the long wavelength side. It is when Ca is used that the highest emission intensity is obtained. Sr and Ba are effective in enhancing the emission intensity.

M2 is an element that contributes to the emission of light. The element is preferred to contain at least Eu. The amount of M2 is in the range of 0.5% to 8%, and more preferably in the range of 2% to 5%, as the atomic ratio based on the total amount of M1 and M2. If the amount of M2 is less than 0.5%, the compound will acquire only low emission intensity because the number of ions that take part in the emission of light is small. If the amount exceeds 8%, the emission efficiency will be lowered due to the recurrent migration of the excitation energy.

The terms x1 and x2 respectively in M1 and M2 are both larger than 0 and less than 2 and their total is likewise larger than 0 and less than 2. The total is preferred to be 0.5 or more because the compound will be deficient not only in emission wavelength but also in emission intensity if the total is unduly small. The total is required to be less than 2, preferably to be 1.5 or less, because the emission wavelength will approximate excessively to the long wavelength side and the emission intensity will be lowered by a stokes loss if the total is unduly large.

M3 is electrically neutral toward oxygen and nitrogen in consideration of the kinds of M1 and M2 and the values of x1 and x2 (with respect to a metal that is contained in the form of oxide or nitride, the total of valences of metal elements and the total of valences of oxygen and nitrogen coincide). Incidentally, M3 is preferred to be Al and Si.

The second version of the phosphor of this invention is an α-sialon-based phosphor that contains at least one of Sr and Ba in an amount of 5 mass % or less.

The form in which at least one of the Sr and Ba exist is indistinct. When the one or two are contained in a minute amount in the α-sialon, the case in which the second phase containing one or both of the Sr and Ba is contained in the form of a crystalline substance or a non-crystalline substance in the α-sialon-based phosphor is conceivable.

The α-sialon-based phosphor of this invention contains one or both of Sr and Ba. The amount thereof (the total when they are both contained) is 5 mass % or less.

The α-sialon-based phosphor is characterized by containing either or both of the two elements Sr and Ba in an amount of 5 mass % or less. If the content of either or both of the two elements Sr and Ba exceeds 5 mass %, the excess will be at a disadvantage in preventing acquisition of sufficient emission intensity. More preferably, the content of either or both of the two elements Sr and Ba is 2 mass % or less. Between the two elements Sr and Ba, Ba is preferred rather than Sr.

By containing either or both of the two elements Sr and Ba, the α-sialon-based phosphor is enabled to enhance the emission intensity conspicuously. Though the principle underlying this enhancement of the emission intensity is not necessarily clear, it may be possibly explained by the supposition that the addition of either or both of the two elements Sr and Ba results in promoting the diffusion of light-emitting ions, enhancing the homogeneity of composition and promoting the growth of grains or the supposition that the inclusion in a minute amount of the elements, Sr and Ba, having comparatively large ion radii results in stabilizing the crystallographic structure of α-sialon and rendering difficult the formation of a crystal defect that deteriorates emission intensity.

The phosphor of the aforementioned general formula and the α-sialon-based phosphor are preferred to have an average particle diameter of 50 μm or less. More preferably the average particle diameter falls between 1 μm and 20 μm. If the average particle falls short of 1 μm, the shortage will result in enlarging the surface area and consequently lowering the emission efficiency. If it exceeds 50 μm, the excess will result in lowering the efficiency of receiving the excitation ray and lowering the ratio of transmitted light and consequently lowering the emission intensity. This particle diameter reported herein is determined in accordance with the laser process.

For the purpose of manufacturing the phosphor of the aforementioned general formula and the α-sialon-based phosphor that are contemplated by this invention, metallic elements constituting a phosphor; oxides, nitrides and oxynitrides thereof; or compounds enabled to form the oxides, nitrides and oxynitrides by heating are used as a raw material mixture.

First, the raw material for the phosphor of the aforementioned general formula will be described.

As the raw material compound containing M1, a simple substance, a mixture of two or more component substances and a double compound selected from metals of Li, Mg, Ca, Sr, Ba, Y, La, Gd and Lu; silicides, oxides, carbonates, nitrides, oxynitides, chlorides and fluorides thereof; and oxyfluorides, hydroxides, oxalates, sulfates, nitrates and organic metal compounds thereof may be used. Specifically, there may be used at least one compound, a mixture of two or more compounds, a double compound, a solid solution and mixed crystal selected from the following compounds: lithium, magnesium, calcium, strontium, barium, yttrium, lanthanum, gadolinium, ruthenium; lithium silicide, magnesium silicide, calcium silicide, strontium silicide, barium silicide, yttrium silicide, lanthanum silicide, gadolinium silicide, ruthenium silicide; lithium oxide, magnesium oxide, calcium oxide, strontium oxide, barium oxide, yttrium oxide, lanthanum oxide, gadolinium oxide, ruthenium oxide; lithium carbonate, magnesium carbonate, calcium carbonate, strontium carbonate, barium carbonate, yttrium carbonate, lanthanum carbonate, gadolinium carbonate, ruthenium carbonate; lithium nitride, magnesium nitride, calcium nitride, strontium nitride, barium nitride, yttrium nitride, lanthanum nitride, gadolinium nitride, ruthenium nitride; lithium oxynitride, magnesium oxynitride, calcium oxynitride, strontium oxynitride, barium oxynitride, yttrium oxynitride, lanthanum oxynitride, gadolinium oxynitride, ruthenium oxynitride; lithium chloride, magnesium chloride, calcium chloride, strontium chloride, barium chloride, yttrium chloride, lanthanum chloride, gadolinium chloride, ruthenium chlorides lithium fluoride, magnesium fluoride, calcium fluoride, strontium fluoride, barium fluoride, yttrium fluoride, lanthanum fluoride, gadolinium fluoride, ruthenium fluoride; lithium oxyfluoride, magnesium oxyfluoride, calcium oxyfluoride, strontium oxyfluoride, barium oxyfluoride, yttrium oxyfluoride, lanthanum oxyfluoride, gadolinium oxyfluoride, ruthenium oxyfluoride; lithium hydroxide, magnesium hydroxide, calcium hydroxide, strontium hydroxide, barium hydroxide, yttrium hydroxide, lanthanum hydroxide, gadolinium hydroxide, ruthenium hydroxide; lithium oxalate, magnesium oxalate, calcium oxalate, strontium oxalate, barium oxalate, yttrium oxalate, lanthanum oxalate, gadolinium oxalate, ruthenium oxalate; lithium sulfate, magnesium sulfate, calcium sulfate, strontium sulfate, barium sulfate, yttrium sulfate, lanthanum sulfate, gadolinium sulfate, ruthenium sulfate; lithium nitrate, magnesium nitrate, calcium nitrate, strontium nitrate, barium nitrate, yttrium nitrate, lanthanum nitrate, gadolinium nitrate, ruthenium nitrate; lithium acetate, magnesium acetate, calcium acetate, strontium acetate, barium acetate, yttrium acetate, lanthanum acetate, gadolinium acetate, ruthenium acetate; methoxy lithium, dimethoxy magnesium, dimethoxy calcium, dimethoxy strontium, dimethoxy barium, trimethoxy yttrium, trimethoxy lanthanum, trimethoxy gadolinium, trimethoxy ruthenium; ethoxy lithium, diethoxy magnesium, diethoxy calcium, diethoxy strontium, diethoxy barium, triethoxy yttrium, triethoxy lanthanum, triethoxy gadolinium, triethoxy ruthenium; propoxy lithium, dipropoxy magnesium, dipropoxy calcium, dipropoxy strontium, dipropoxy barium, tripropoxy yttrium, tripropoxy lanthanum, tripropoxy gadolinium, tripropoxy ruthenium; butoxy lithium, dibutoxy magnesium, dibutoxy calcium, dibutoxy strontium, dibutoxy barium, tributoxy yttrium, tributoxy lanthanum, tributoxy gadolinium, tributoxy ruthenium; bis(pivaloylmethanato) lithium, bis(dipivaloylmethanato) magnesium, bis(dipivaloylmethanato) calcium, bis (dipivaloylmethanato) strontium, bis(dipivaloylmethanato) barium, bis(tripivaloylmethanato) yttrium, bis(tripivaloylmethanato) lanthanum, bis(tripivaloylmethanato) gadolinium and bis-(tripivaloylmethanato) ruthenium.

Of these compounds, carbonates or hydroxides prove preferable and carbonates prove particularly preferable.

As the raw material compound containing M2, a simple substance, a mixture of two or more substances and a double compound selected from the metals of Ce, Pr, Eu, Tb, Yb and Er; silicides, oxides, carbonates, nitrides, oxynitrides, chlorides and fluorides thereof; and oxyfluorides, hydroxides, oxalates, sulfates, nitrates and organic metal compounds thereof may be used. Specifically, there may be used at least one compound, a mixture of two or more compounds, a double compound, a solid solution and a mixed crystal selected from the following compounds: cerium, praseodymium, europium, terbium, ytterbium, erbium; cerium silicide, praseodymium silicide, europium silicide, terbium silicide, ytterbium silicide, erbium silicide; cerium oxide, praseodymium oxide, europium oxide, terbium oxide, ytterbium oxide, erbium oxide; cerium carbonate, praseodymium carbonate, europium carbonate, terbium carbonate, ytterbium carbonate, erbium carbonate; cerium nitride, praseodymium nitride, europium nitride, terbium nitride, ytterbium nitride, erbium nitride; cerium oxynitride, praseodymium oxynitride, europium oxynitride, terbium oxynitride, ytterbium oxynitride, erbium oxynitride; cerium chloride, praseodymium chloride, europium chloride, terbium chloride, ytterbium chloride, erbium chloride; cerium fluoride, praseodymium fluoride, europium fluoride, terbium fluoride, ytterbium fluoride, erbium fluoride; cerium oxyfluoride, praseodymium oxyfluoride, europium oxyfluoride, terbium oxyfluoride, ytterbium oxyfluoride, erbium oxyfluoride; cerium hydroxide, praseodymium hydroxide, europium hydroxide, terbium hydroxide, ytterbium hydroxide, erbium hydroxide; cerium oxalate, praseodymium oxalate, europium oxalate, terbium oxalate, ytterbium oxalate, erbium oxalate; cerium sulfate, praseodymium sulfate, europium sulfate, terbium sulfate, ytterbium sulfate, erbium sulfate; cerium nitrate, praseodymium nitrate, europium nitrate, terbium nitrate, ytterbium nitrate, erbium nitrate; cerium acetate, praseodymium acetate, europium acetate, terbium acetate, ytterbium acetate, erbium acetate; trimethoxy cerium, trimethoxy praseodymium, trimethoxy europium, trimethoxy terbium, trimethoxy ytterbium, trimethoxy erbium; triethoxy cerium, triethoxy praseodymium, triethoxy europium, triethoxy terbium, triethoxy ytterbium, triethoxy erbium; tripropoxy cerium, tripropoxy praseodymium, tripropoxy europium, tripropoxy terbium, tripropoxy ytterbium, tripropoxy erbium; tributoxy cerium, tributoxy praseodymium, tributoxy europium, tributoxy terbium, tributoxy ytterbium, tributoxy erbium; bis(tripivaloylmethanato) cerium, bis(tripivaloylmethanato) praseodymium, bis(tripivaloylmethanato) europium, bis(tripivaloylmethanato) ytterbium and bis(tripivaloylmethanato) erbium.

Of these compounds, oxides, carbonates or hydroxides prove preferable and oxides prove particularly preferable.

As the raw material compound containing M3, a simple substance, a mixture of two or more substances and a double compound selected from the metals of Si, Ge, Sn, B, Al, Ga and In; oxides, carbonates, nitrides, oxynitrides, chlorides and fluorides; and oxyfluorides, hydroxides, oxalates, sulfates, nitrates and organic metal compounds thereof may be used. Specifically, there may be used at least one compound, a mixture of two or more compounds, a double compound, a solid solution and a mixed crystal selected from the following compounds: silicon, germanium, tin, boron, aluminum, gallium, indium; silicon oxide, germanium oxide, tin oxide, boron oxide, aluminum oxide, gallium oxide, indium oxide; silicon nitride, germanium nitride, tin nitride, boron nitride, aluminum nitride, gallium nitride, indium nitride; silicon oxynitride, germanium oxynitride, tin oxynitride, boron oxynitride, aluminum oxynitride, gallium oxynitride and indium oxynitride.

As the raw material compound for silicon oxide, silicon oxide or a compound enabled to form silicon oxide by heating may be used. For example, at least one compound selected from silicon dioxide, silicon monoxide, tetramethoxy silane, tetraethoxy silane, tetrapropoxy silane, tetrabutoxy silane and tris(dimethylamino) silane, for example, may be used. A mixture of two or more of these compounds, a solid solution or a mixed crystal may be used.

As the raw material compound for silicon nitride, silicon nitride or a compound enabled to form silicon nitride by heating may be used. For example, at least one compound selected from silicon diimides and polysilazanes may be used. Further, the same result as this selection can be acquired by mixing at least one compound selected from silicon, silicon dioxide, silicon monoside, tetramethoxy silane, tetraethoxy silane, tetrapropoxy silane, tetrabutoxy silane and tris(dimethylamino) silane with carbon or a compound enabled to form carbon by heating and heating the resultant mixture in nitrogen or a nitrogen-containing nonoxidizing atmosphere. When the raw material happens to be a solid substance, it is preferred to be in the state of powder. Though the grain size of the raw material is not restricted, the raw material of microstructure is at an advantage in excelling in reactivity. The purity of this raw material is preferred to be 90% or more.

As the raw material for the α-sialon-based phosphor, the same compound that is selected from the metals of Si and Al, oxides, nitrides and oxynitrides thereof as described regarding M3 in the aforementioned general formula can be used. Also as to Sr and Ba, the metals of Sr and Ba and all the compounds thereof as described regarding M3 in the aforementioned general formula can be used. When the α-sialon-based phosphor is preferred to contain the metals and the compounds of M1 and M2, they may be used as the raw materials for the compounds of M1 and M2.

As part of the raw material mixture for the phosphor of the aforementioned general formula and the α-sialon-based phosphor, compounds selected from those represented by the following general formulas can be used. The general formulas are $(M4)(M3)_6N_7O_2$, $(M4)(M3)_3N_2O_3$, $(M4)_3(M3)_2N_2O_4$, $(M4)(M3)_2N_2O_2$, $(M4)_2(M3)_3N_4O_2$, $(M4)_2(M3)_3N_2O_5$ and $(M4)(M3)_2N_3$ (wherein M4 denotes one or more metal elements selected from the group consisting of Li, Mg, Ca, Sr, Ba, Y, La, Gd, Lu, Ce, Pr, Eu, Tb, Yb and Er, and M3 denotes one or more metal elements selected from the group consisting of Si, Ge, Sn, B, Al, Ga and In).

More specifically, $(M5)AlSi_5N_7O_2$, $(M5)Al_2SiN_2O_3$, $3(M5)O.Si_2N_2O$, $(M5)O.Si_2N_2O$, $2(M5)O.Si_3N_4$, $2(M5)O.Si_2N_2O.SiO_2$ and $(M5)AlSiN_3$ (wherein M5 denotes one or more metal elements selected from the group consisting of Mg, Ca, Sr and Ba) may be cited. Particularly when M5 happens to be Ba, the raw material mixture is preferred to be $BaAlSi_5N_7O_2$. When these compounds are synthesized in advance, subjected as occasion demands to treatment, such as pulverization, and used as part of the raw material compound, this procedure is at an advantage in enhancing the homogeneity of the raw material compound, ensuring production of the target phosphor at a low temperature and enabling the produced phosphor to possess enhanced emission intensity. When the liquid phase possessing the composition of these compounds is generated during the course of firing, it exerts a favorable influence toward enhancing the emission intensity because it promotes the diffusion of light-emitting ions, enhances the homogeneity of the composition and advances the growth of grains. When these compounds are added in the form of an additive to the raw material for the α-sialon-based phosphor or the phosphor of the aforementioned general formula or they are made to form a composition having the components compounded like making the addition in the form of an additive, the phosphor that is formed of the mixed phase arising between these phosphors and these compounds may be possibly obtained. It goes without saying that the same effect is obtained by selecting the conditions of synthesis of these compounds so that the compounds may form an intermediate product.

The method for manufacturing the oxynitride phosphor of this invention does not need to be particularly limited but may adopt a solid-phase method, a liquid-phase method or a vapor-phase method. In the case of the solid-phase method, the following method may be cited.

First, the raw-material compounds are weighed out in a prescribed ratio and mixed. The mixing may be effected by the use of a ball mill. While the ball mill mixing is attained in a dry process, it may be fulfilled in a wet process using ethanol, acetone, butanol, hexane or water. The wet mixing process is preferred to the dry mixing process for the purpose of heightening the reactivity of the raw material powder. When the wet mixing is carried out, the mixed slurry consequently obtained is dried and then crushed or classified as occasion demands.

Here, the raw-material compound, when necessary, may add a flux for subsequent mixture therewith. The halogenide of an alkali metal or the halogenide of an alkaline earth metal is usable as the flux. It is added in an amount in the range of 0.01 to 20 parts by mass based on 100 parts by mass of the raw material for the phosphor.

The phosphor powder synthesized in advance, when necessary, may be added as a seed and mixed with the raw-material compound. The amount of the seed to be added is in the range of 1 to 50 parts by mass based on 100 parts by mass of the raw material for the phosphor. Since the addition of the seed promotes the reaction of synthesis, it enables the synthesis to proceed at a low temperature and allows production of the phosphor possessing a high degree of crystallinity and consequently results in enhancing emission intensity.

The raw material mixture is packed in a crucible made of alumina, calcia, magnesia, graphite or boron nitride and fired in vacuum or a nonoxidizing atmosphere at 1600 to 2200° C. for several hours. It may be pressed, when necessary, in the nonoxidizing atmosphere. The term "nonoxidizing atmosphere" as used herein refers to nitrogen, hydrogen, ammonia, argon or a mixture thereof. The firing conditions that are favorable are the pressure of nitrogen gas exceeding 0.5 MPa and falling short of 1 MPa and the temperature falling in the range of 1800 to 2050° C.

Then, the amount of the raw material mixture to be packed in the crucible is preferred to be 20 volume % or more of the crucible to be used. If this amount falls short of 20 volume %, the shortage will not merely harm economy but also induce volatilization of elements, such as europium, which form the raw material mixture and prevent acquisition of the phosphor possessing the quality or performance aimed at.

In the phosphor of this invention, the europium exhibits excellent emission when it has a positive bivalence. Since the europium oxide used as a raw material is in a trivalent state, it is required to be reduced in the course of firing. The ratio of the bivalence and the trivalence is preferred to have the bivalence in as large an amount as possible. The ratio of the bivalence to the whole europium is preferably 50% or more, and more preferably 80% or more. In the phosphor of this invention, since the europium is added by substituting the site of the bivalent alkaline earth metal, the survival of trivalent europium collapses the balance of electrical charge and results in lowering emission intensity. Incidentally, the ratio between the bivalence and the trivalence of europium can be determined by assay according to the Mossbauer spectroscopy.

When the firing of the raw material mixture is carried out in the presence of carbon or a carbon-containing compound, the reduction of the europium oxide proceeds promptly. The carbon or the carbon-containing compound that is used herein does not need to be particularly restricted, but may be amorphous carbon, graphite or silicon carbide. Preferably, it is amorphous carbon or graphite. Carbon black, graphite powder, activated carbon, silicon carbide powder and fabricated products and sintered products thereof may be cited, for example. They are invariably capable of producing similar effects. As concerns the mode of causing the aforementioned presence during the firing, the case of using a crucible made of carbon or a carbon-containing compound, the case of causing the carbon or the carbon-containing compound to be disposed inside or outside the crucible made of a material other than carbon or a carbon-containing compound and the case of using a heating element or an heat-insulating element made of carbon or a carbon-containing compound are conceivable. These methods of disposition are invariably capable of producing similar effects. The carbon or the carbon-containing compound in whose presence the firing is caused to proceed is properly in an amount approximately equimolar to the europium oxide in the raw material mixture when the powdery carbon, for example, is contained in the raw material mixture and fired in the atmosphere of nitrogen. Incidentally, the carbon or the carbon-containing compound has an equal effect even for Ce.

The product of the firing is cooled, then subjected, as occasion demands, to the treatment of dispersion and pulverization as with a ball mill, further subjected, as occasion demands, to an acid treatment and a rinsing treatment, and advanced through the steps of solid-liquid separation, drying, crushing and classification to obtain the phosphor of this invention.

For the acid treatment, at least one member selected from mineral acids, such as hydrofluoric acid, sulfuric acid, phosphoric acid, hydrochloric acid, nitric acid or the aqueous solution thereof, is used.

The phosphor of this invention is efficiently excited with an ultraviolet ray or a visible ray ranging from 250 nm through 500 nm and, therefore, can be effectively applied to the products of white LED using an ultraviolet LED or a blue LED and the products of white EL using an EL light-emitting device as a light source.

A light-emitting device can be constructed by combining the phosphor that is the preferred embodiment of this invention and a semiconductor light-emitting device or an EL light-emitting device generating emission in a wavelength range of 250 nm to 500 nm. As the light-emitting devices available in this case, various semiconductors, such as of ZnSe and GaN, and EL light-emitting devices may be cited.

Though the light-emitting device can be used interminably so long as the emission spectrum thereof extends from 250 nm through 500 nm, the LED that is preferably used is a gallium nitride-based compound semiconductor from the viewpoint of efficiency. The LED light-emitting device is obtained by having a nitride-based compound semiconductor formed on a substrate as by the MOCVD method or the HVPE method preferably using a light-emitting layer of $In_\alpha Al_\beta Ga_{1-\alpha-\beta}N$ (wherein $0 \leq \alpha$, $0 \leq \beta$, $\alpha+\beta \leq 1$). As the configuration of the semiconductor, the homostructure, heterostructure or double-heterostructure that possesses an MIS junction, a PIN junction or a p-n junction may be cited. The emission wavelength can be variously selected depending on the material of the semiconductor layer and the degree of mixed crystal thereof. The semiconductor active layer may be formed in a single quantum well structure or a multi-quantum-well structure, namely a thin film capable of generating a quantum effect.

Even when the light-emitting device happens to be an EL device, it can be used interminably so long as the emission spectrum thereof extends from 250 nm through 500 nm. Thus, the inorganic and organic EL devices are invariably usable.

When the light-emitting device happens to be an inorganic EL, it may be in any of the forms including a thin film form, a dispersed form, a direct current drive form and an alternating current drive form. Though the phosphor that participates in the EL emission does not need to be particularly limited, it is preferred to be sulfide-based for the sake of ensuring convenience of use.

When the light-emitting device happens to be an organic EL, it may be in any of the forms including a stacked form, a doped form, a low-molecular form and a high molecular form.

The phosphor layer disposed on the light-emitting device may have at least one kind of phosphor deposited in a single layer or in a plurality of lamellarly stacked layers or may have a plurality of phosphors deposited as mixed in a single layer. As regards the form of disposing the phosphor layer on the light-emitting device, the form of having the phosphor mixed in a coating member coating the surface of a light-emitting device, the form of having the phosphor mixed in a molding member, the form of having the phosphor mixed in a coating member coating a molding member and the form of disposing in front of the light-emitting side of an LED lamp or EL lamp a translucent plate resulting from mixing the phosphor may be cited.

Further, the phosphor allows addition of at least one kind of phosphor to the molding member on the light-emitting device. The phosphor layer formed of one or more kinds of the aforementioned phosphors may be disposed outside the light-emitting diode. As regards the form of having the phosphor layer disposed outside the light-emitting diode, the form of having the phosphor applied in the form of a layer to the outer surface of the molding member of the light-emitting diode, the form of preparing a molded body (such as, for example, a cap) having the phosphor dispersed in rubber, resin, elastomer or low-melting glass and coating the LED with the molded body, and the form of having the molded body shaped in the form of a flat plate and disposing the flat plate in front of the LED or EL light-emitting device may be cited.

The molding member is allowed to contain a diffusing agent that includes titanium oxide; titanium nitride; tantalum nitride; aluminum oxide; silicon oxide; barium titanate; germanium oxide; mica; hexagonal boron nitride; mica coated with white powder of titanium oxide, aluminum oxide, silicon oxide, barium titanate, germanium oxide or hexagonal boron nitride; and hexagonal boron nitride coated with white powder of titanium oxide, aluminum oxide, silicon oxide, barium titanate or germanium oxide.

Now, this invention will be described below by reference to examples. This invention nevertheless is not limited to these specific examples. In the following examples, the emission spectrum reported was determined by using a product of JASCO Corporation, Japan, marketed under the product code of "FP-6500."

EXAMPLE 1

As the raw material for forming phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet process using ethanol in a ball mill, and drying and crushing the resultant slurry. Next, the raw material mixture thus obtained was packed to about 80 volume % in a crucible made of hexagonal boron nitride, placed in a firing furnace formed of a heat-insulating element made of graphite and a heating element made of graphite, and fired at a temperature of 1950° C. for two hours under nitrogen pressure of 0.8 MPa. The fired product consequently obtained was crushed and classified with a ball mill to obtain a phosphor having an average particle diameter of 11.5 µm. When this phosphor was analyzed by the high-frequency inductively coupled plasma (ICP) optical emission spectroscopy, it was found to have a Ba concentration of 1.1 mass %. The examination of the same specimen by the powder X-ray diffraction method resulted in detecting α-sialon as a component phase. When the phosphor was caused to emit light under the excitation of 380 nm, it was recognized to emit a yellow light.

EXAMPLE 2

When the phosphor obtained in Example 1 was caused to emit light under the excitation of 450 nm, it was recognized to emit a yellow color. The intensity of this emission would be taken as 100.

EXAMPLE 3

The phosphor obtained in Example 1 was mixed in a ratio of 29 mass % with silicone resin and the resultant mixture was molded in the shape of a cap using a hot press. When the cap was put on the outside of a near ultraviolet ray LED having an emission wavelength of 380 nm and allowed to emit light, it was observed to generate a yellow light. Even after 500 hours' lighting under the conditions of 60° C. of temperature and 90% of RH (relative humidity), it showed no discernible change due to the phosphor.

EXAMPLE 4

When a white LED fabricated by mixing 8.1 mass % and 9.2 mass % respectively of the phosphor obtained in Example 1 and $Sr_5(PO_4)_3Cl$:Eu as a blue light-emitting phosphor in the order mentioned with silicone resin and mounting the resultant mixture on a near ultraviolet light-emitting device was compared with a white LED fabricated by mixing 45.8 mass %, 3.8 mass % and 3.4 mass % respectively of $Y_2O_2S$:Eu as a red light-emitting phosphor, $Sr_5(PO_4)_3Cl$:Eu as a blue light-emitting phosphor and $BaMg_2Al_{16}O_{27}$:Eu, Mn as a green light-emitting phosphor in the order mentioned with silicone resin and mounting the resultant mixture on a near ultraviolet light-emitting device, the white LED using the phosphor obtained in Example 1 and $Sr_5(PO_4)_3Cl$:Eu as the blue light-emitting phosphor acquired a white light possessing luminance 2.7 times as high as the other white LED.

EXAMPLE 5

When a white LED was fabricated by mixing the phosphor obtained in Example 1 in a ratio of 19.1 mass % with silicone resin and mounting the resultant mixture on a 450 nm blue light-emitting device, the white light emitted by the white LED had emission efficiency of 63 lm/W.

EXAMPLE 6

As a raw material for forming a phosphor, a phosphor powder was obtained by accurately weighing out 0.73 g of europium oxide powder, 68.46 g of silicon nitride powder, 14.72 g of aluminum nitride powder, 10.64 g of calcium carbonate powder and 5.45 g of barium carbonate powder and processing them by following the procedure of Example 1. When this phosphor was made to emit light under the excitation of 450 nm, it exhibited emission of yellow light. The intensity of the emission was 93 based on the phosphor of Example 1. When this phosphor was analyzed by the high-frequency ICP optical emission spectroscopy, it was found to have a Ba concentration of 3.4 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 7

As a raw material for forming a phosphor, a phosphor powder was obtained by accurately weighing out 0.78 g of europium oxide powder, 69.78 g of silicon nitride powder, 15.14 g of aluminum nitride powder, 11.39 g of calcium carbonate powder and 2.92 g of barium carbonate powder and processing them by following the procedure of Example 1. When this phosphor was made to emit light under the excitation of 450 nm, it exhibited emission of yellow light. The intensity of the emission was 98 based on the phosphor of Example 1. When this phosphor was analyzed by the high-frequency ICP optical emission spectroscopy, it was found to have a Ba concentration of 1.8 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 8

As a raw material for forming a phosphor, a phosphor powder was obtained by accurately weighing out 0.81 g of europium oxide powder, 69.62 g of silicon nitride powder, 16.90 g of aluminum nitride powder, 11.77 g of calcium carbonate powder and 0.90 g of barium carbonate powder and processing them by following the procedure of Example 1. When this phosphor was made to emit light under the excitation of 450 nm, it exhibited emission of yellow light. The intensity of the emission was 100 based on the phosphor of Example 1. When this phosphor was analyzed by the high-frequency ICP optical emission spectroscopy, it was found to have a Ba concentration of 0.54 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 9

As a raw material for forming a phosphor, a phosphor powder was obtained by accurately weighing out 0.83 g of europium oxide powder, 71.14 g of silicon nitride powder, 15.57 g of aluminum nitride powder, 12.15 g of calcium carbonate powder and 0.31 g of barium carbonate powder and processing them by following the procedure of Example 1. When this phosphor was made to emit light under the excitation of 450 nm, it exhibited emission of yellow light. The intensity of the emission was 99 based on the phosphor of Example 1. When this phosphor was analyzed by the high-frequency ICP optical emission spectroscopy, it was found to have a Ba concentration of 0.18 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 10

As a raw material for forming a phosphor, a phosphor powder was obtained by accurately weighing out 0.84 g of europium oxide powder, 71.22 g of silicon nitride powder, 15.60 g of aluminum nitride powder, 12.19 g of calcium carbonate powder and 0.16 g of barium carbonate powder and processing them by following the procedure of Example 1. When this phosphor was made to emit light under the excitation of 450 nm, it exhibited emission of yellow light. The intensity of the emission was 97 based on the phosphor of Example 1. When this phosphor was analyzed by the high-frequency ICP optical emission spectroscopy, it was found to have a Ba concentration of 0.092 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 11

As a raw material for forming a phosphor, a phosphor powder was obtained by following the procedure of Example 1 while accurately weighing out 0.80 g of europium oxide powder, 70.36 g of silicon nitride powder, 15.32 g of aluminum nitride powder, 11.71 g of calcium carbonate powder and 1.80 g of barium carbonate powder, firing them at a temperature of 1900° C., crushing and classifying the resultant fired product with a ball mill and obtaining a phosphor having an average particle diameter of 3.8 μm. When this phosphor was made to emit light under the excitation of 450 nm, it exhibited emission of yellow light. The intensity of the emission was 98 based on the phosphor of Example 1. When this phosphor was analyzed by the high-frequency ICP optical emission spectroscopy, it was found to have a Ba concentration of 1.2 mass %. The examination of the same specimen by the powder X-ray diffraction method resulted in detecting diffraction patterns corresponding to JCPDS 67-9891 $Ca_{0.67}(Si_{10}Al_2)(N_{15.3}O_{0.7})$ and JCPDS 68-1640 $BaAlSi_5N_7O_2$.

EXAMPLE 12

As a raw material for forming a phosphor, a phosphor powder was obtained by following the procedure of Example 1 while accurately weighing out 0.80 g of europium oxide powder, 70.36 g of silicon nitride powder, 15.32 g of aluminum nitride powder, 11.71 g of calcium carbonate powder and 1.80 g of barium carbonate powder, firing them at a temperature of 2000° C., crushing and classifying the resultant fired product with a ball mill and obtaining a phosphor having an average particle diameter of 3.8 μm. When this phosphor was made to emit light under the excitation of 450 nm, it exhibited emission of yellow light. The intensity of the emission was 103 based on the phosphor of Example 1. When this phosphor was analyzed by the high-frequency ICP optical emission spectroscopy, it was found to have a Ba concentration of 0.92 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 13

As a raw material for forming a phosphor, a phosphor powder was obtained by accurately weighing out 0.81 g of europium oxide powder, 70.68 g of silicon nitride powder, 15.39 g of aluminum nitride powder, 11.77 g of calcium carbonate powder and 1.35 g of strontium carbonate powder and processing them by following the procedure of Example 1. When this phosphor was made to emit light under the excitation of 450 nm, it exhibited emission of yellow light. The intensity of the emission was 98 based on the phosphor of Example 1. When this phosphor was analyzed by the high-frequency ICP optical emission spectroscopy, it was found to have an Sr concentration of 0.69 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 14

As a raw material for forming a phosphor, a phosphor powder was obtained by accurately weighing out 0.80 g of europium oxide powder, 70.52 g of silicon nitride powder, 15.36 g of aluminum nitride powder, 11.74 g of calcium carbonate powder, 0.67 g of strontium carbonate powder and 0.90 g of barium carbonate powder and processing them by following the procedure of Example 1. When this phosphor was made to emit light under the excitation of 450 nm, it exhibited emission of yellow light. The intensity of the emission was 99 based on the phosphor of Example 1. When this phosphor was analyzed by the high-frequency ICP optical emission spectroscopy, it was found to have an Sr concentration of 0.33 mass % and a Ba concentration of 0.45 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 15

As a raw material for forming a phosphor, a phosphor powder was obtained by accurately weighing out 0.80 g of europium oxide powder, 70.36 g of silicon nitride powder, 15.32 g of aluminum nitride powder, 11.71 g of calcium carbonate powder, 1.80 g of barium carbonate powder and 10 g of a phosphor powder having an average particle diameter of 2.1 μm resulting from further pulverizing and classifying the phosphor powder obtained in Example 1 and processing them by following the procedure of Example 1. When this phosphor was made to emit light under the excitation of 450 nm, it exhibited emission of yellow light. The intensity of the emission was 105 based on the phosphor of Example 1. When this phosphor was analyzed by the high-frequency ICP optical emission spectroscopy, it was found to have a Ba concentration of 0.97 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 16

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crushing the resultant slurry. Then, the raw material mixture consequently obtained was packed in a ratio of about 80 volume % in a crucible made of hexagonal boron nitride, placed in a firing furnace formed of heat-insulating element made of graphite and a heating element made of graphite, and fired at a temperature of 1950° C. for 0.5 hour under nitrogen pressure of 0.8 MPa. The resultant fired product was crushed and classified in a ball mill to obtain a phosphor having an average particle diameter of 1.3 μm. When this phosphor was made to emit light under the excitation of 450 nm, it exhibited emission of yellow light. The intensity of the emission was 98 based on the phosphor of Example 1. When this phosphor was analyzed by the high-frequency ICP optical emission spectroscopy, it was found to have a Ba concentration of 1.2 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 17

As a raw material for forming a phosphor, a phosphor powder was obtained by following the procedure of Example 1 while accurately weighing out 0.80 g of europium oxide powder, 70.36 g of silicon nitride powder, 15.32 g of aluminum nitride powder, 11.71 g of calcium carbonate powder and 1.80 g of barium carbonate powder, firing them at a temperature of 2050° C., crushing and classifying the resultant fired product with a ball mill and obtaining a phosphor having an average particle diameter of 14.3 μm. When this phosphor was made to emit light under the excitation of 450 nm, it exhibited emission of yellow light. The intensity of the emission was 100 based on the phosphor of Example 1. When this phosphor was analyzed by the high-frequency ICP optical emission spectroscopy, it was found to have a Ba concentration of 0.73 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 18

As a raw material for forming a phosphor, a phosphor powder was obtained by following the procedure of Example 1 while accurately weighing out 0.80 g of europium oxide powder, 70.36 g of silicon nitride powder, 15.32 g of aluminum nitride powder, 11.71 g of calcium carbonate powder and 1.80 g of barium carbonate powder, firing them at a temperature of 2100° C., crushing and classifying the resultant fired product with a ball mill and obtaining a phosphor having an average particle diameter of 23.2 μm. When this phosphor was made to emit light under the excitation of 450 nm, it exhibited emission of yellow light. The intensity of the emission was 94 based on the phosphor of Example 1. When this phosphor was analyzed by the high-frequency ICP optical emission spectroscopy, it was found to have a Ba concentration of 0.53 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 19

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crush the resultant slurry. Then, the raw material mixture consequently obtained was packed in a ratio of about 80 volume % in a crucible made of hexagonal boron nitride, placed in a firing furnace formed of heat-insulating element made of graphite and a heating element made of graphite, and fired at a temperature of 2000° C. for 24 hours under nitrogen pressure of 0.8 MPa. The resultant fired product was crushed and classified in a ball mill to obtain a phosphor having an average particle diameter of 47.1 μm. When this phosphor was made to emit light under the excitation of 450 nm, it exhibited emission of yellow light. The intensity of the emission was 98 based on the phosphor of Example 1. When this phosphor was analyzed by the high-frequency ICP optical emission spectroscopy, it was found to have a Ba concentration of 0.47 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 20

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crushing the resultant slurry. Then, a phosphor powder was obtained by following the procedure of Example 1 while having the raw material mixture packed in a ratio of about 40 volume % in a crucible made of hexagonal boron nitride. When this phosphor was made to emit light under the excitation of 450 nm, it exhibited emission of yellow light. The intensity of the emission was 95 based on the phosphor of Example 1. When this phosphor was analyzed by the high-frequency ICP optical emission spectroscopy, it was found to have a Ba concentration of 1.1 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 21

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crushing the resultant slurry. Then, a phosphor powder was obtained by following the procedure of Example 1 while having the raw material mixture packed in a ratio of about 20 volume % in a crucible made of hexagonal boron nitride. When this phosphor was made to emit light under the excitation of 450 nm, it exhibited emission of yellow light. The intensity of the emission was 81 based on the phosphor of Example 1. When this phosphor was analyzed by the high-frequency ICP optical emission spectroscopy, it was found to have a Ba concentration of 0.9 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 22

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crushing the resultant slurry. Then, a phosphor powder was obtained by following the procedure of Example 1 while having the raw material mixture packed in a crucible made of high-purity alumina refractory. When this phosphor was made to emit light under the excitation of 450 nm, it exhibited emission of yellow light. The intensity of the emission was 92 based on the phosphor of Example 1. When this phosphor was analyzed by the high-frequency ICP optical emission spectroscopy, it was found to have a Ba concentration of 1.1 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 23

As a raw material for forming a phosphor, a raw material mixture was obtained by accurately weighing out 0.80 g of europium oxide powder, 70.36 g of silicon nitride powder, 15.32 g of aluminum nitride powder, 11.71 g of calcium carbonate powder and 1.80 g of barium carbonate powder, homogeneously mixing them by the wet method using ethanol in a ball mill and drying and crushing the resultant slurry. Then, a phosphor powder was obtained by following the procedure of Example 1 while firing the raw material mixture consequently obtained at a temperature of 1900° C., packing the resultant fired product in a ratio of about 80 volume % in crucible made of hexagonal boron nitride, putting this crucible in a sample case made of graphite and firing the sample in the crucible by using a firing furnace formed of a heat-insulating element made of alumina refractory and a heating element made of lanthanum chromite. When the phosphor consequently obtained was made to emit light under the excitation of 450 nm, it exhibited emission of yellow light. The intensity of the emission was 94 based on the phosphor of Example 1. When this phosphor was analyzed by the high-frequency ICP optical emission spectroscopy, it was found to have a Ba concentration of 1.2 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 24

As a raw material for forming a phosphor, a phosphor powder was obtained by following the procedure of Example 1 while accurately weighing out 0.84 g of europium oxide powder, 71.26 g of silicon nitride powder, 15.61 g of aluminum nitride powder, 12.22 g of calcium carbonate powder and 0.078 g of barium carbonate powder. When this phosphor was made to emit light under the excitation of 450 nm, it exhibited emission of yellow light. The intensity of the emission was 90 based on the phosphor of Example 1. When this phosphor was analyzed by the high-frequency ICP optical emission spectroscopy, it was found to have a Ba concentration of 0.046 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 25

As a raw material for forming a phosphor, a phosphor powder was obtained by following the procedure of Example 1 while accurately weighing out 0.66 g of europium oxide powder, 64.96 g of silicon nitride powder, 18.55 g of aluminum nitride powder, 9.65 g of calcium carbonate powder and 6.17 g of barium carbonate powder. When this phosphor was made to emit light under the excitation of 450 nm, it exhibited emission of yellow light. The intensity of the emission was 90 based on the phosphor of Example 1. When this phosphor was analyzed by the high-frequency ICP optical emission spectroscopy, it was found to have a Ba concentration of 4.0 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 26

As a raw material for forming a phosphor, a phosphor powder was obtained by following the procedure of Example 1 while accurately weighing out 0.84 g of europium oxide powder, 71.30 g of silicon nitride powder, 15.62 g of aluminum nitride powder and 12.24 g of calcium carbonate powder and crushing and classifying the resultant fired product with a ball mill, thereby obtaining a phosphor having an average particle diameter of 3.2 µm. when this phosphor was made to emit light under the excitation of 450 nm, it exhibited emission of yellow light. The intensity of the emission was 66 based on the phosphor of Example 1. When this phosphor was analyzed by the high-frequency ICP optical emission spectroscopy, it was found to have a Ba concentration of 0 mass %. The examination of the same specimen by the powder X-ray diffraction method resulted in detecting a diffraction pattern corresponding to JCPDS 67-9891 $Ca_{0.67}(Si_{10}Al_2)(N_{15.3}O_{0.7})$.

EXAMPLE 27

As a raw material for forming a phosphor, a phosphor powder was obtained by following the procedure of Example 1 while accurately weighing out 0.80 g of europium oxide powder, 70.36 g of silicon nitride powder, 15.32 g of aluminum nitride powder, 11.71 g of calcium carbonate powder and 1.80 g of barium carbonate powder and firing them at a temperature of 1800° C. When this phosphor was made to emit light under the excitation of 450 nm, it exhibited emission of yellow light. The intensity of the emission was 67 based on the phosphor of Example 1. When this phosphor was analyzed by the high-frequency ICP optical emission spectroscopy, it was found to have a Ba concentration of 1.3 mass %. The examination of the same specimen by the powder X-ray diffraction method resulted in detecting diffraction patterns corresponding to JCPDS 67-9891 $Ca_{0.67}(Si_{10}Al_2)(N_{15.3}O_{0.7})$ and JCPDS 68-1640 $BaAlSi_5N_7O_2$.

EXAMPLE 28

As a raw material for forming a phosphor, a phosphor powder was obtained by following the procedure of Example 1 while accurately weighing out 0.71 g of europium oxide powder, 62.88 g of silicon nitride powder, 15.43 g of aluminum nitride powder, 10.36 g of calcium carbonate powder and 10.61 g of barium carbonate powder. When this phosphor was made to emit light under the excitation of 450 nm, it exhibited emission of yellow light. The intensity of the emission was 63 based on the phosphor of Example 1. When this phosphor was analyzed by the high-frequency ICP optical emission spectroscopy, it was found to have a Ba concentration of 7.1 mass %. The examination of the same specimen by the powder X-ray diffraction method resulted in detecting diffraction patterns corresponding to JCPDS 67-9891 $Ca_{0.67}(Si_{10}Al_2)(N_{15.3}O_{0.7})$, and JCPDS 68-1640 $BaAlSi_5N_7O_2$.

EXAMPLE 29

When white EL lamps were fabricated by causing the phosphor obtained in Example 1 and a YAG:Ce phosphor each to be mixed in a ratio of 20 mass % with silicone resin and mounting the resultant mixtures each on a 450 nm blue light-emitting EL device. The luminance of the white EL lamp fabricated by using the phosphor obtained in Example 1 was 1.4 times as high as the luminance of the white EL lamp fabricated by using the YAG:Ce phosphor.

Industrial Applicability

A white light can be produced by combining the phosphor of this invention as with a blue light-emitting diode and can be utilized as the light source for illumination or as the light source for display.

The invention claimed is:

1. An α-sialon-based phosphor represented by $(Ca,M1)_{(x1)}M2_{(x2)}M3_{(12)}(O,N)_{16}$, wherein M1 is Ba, M2 is Eu, M3 is one or more metal elements selected from the group consisting of Si and Al, and x1 and x2 satisfy $0<x1$, $x2<2$ and $0<x1+x2<2$.

2. The α-sialon-based phosphor according to claim 1 containing Ba in an amount of 5 mass % or less.

3. The α-sialon-based phosphor according to claim 1, having an average particle diameter of 50 µm or less.

4. A method for manufacturing the α-sialon-based phosphor according to claim 1, comprising firing a raw material mixture of the phosphor in a non-oxidizing atmosphere at 1600 to 2200° C.

5. The method according to claim 4, wherein the firing is effected in a presence of carbon or a carbon-containing compound.

6. The method according to claim 4, wherein the raw material mixture has added thereto a target phosphor powder synthesized in advance as a seed.

7. The method according to claim 4, wherein the raw material mixture is packed in advance in a crucible made of alumina, calcia, magnesia, graphite or boron nitride.

8. The method according to claim 7, wherein the raw material mixture is packed in advance in an amount of 20 volume % or more of the crucible.

9. The method according to claim 4, wherein the raw material mixture is a mixture or a double compound selected from the group consisting of metals, silicides, oxides, carbonates, nitrides, oxynitrides, chlorides, fluorides, oxyfluorides, hydroxides, oxalates, sulfates, nitrates, organic metal compounds and compounds enabled by heating to form oxides, nitrides and oxynitrides.

10. A light-emitting apparatus combining the phosphor according to claim 1 and a light-emitting device.

11. The light-emitting apparatus according to claim 10, wherein the light-emitting device is a nitride-based semiconductor light-emitting device and has an emission wavelength of 250 nm to 500 nm.

12. The light-emitting apparatus according to claim 10, wherein the light-emitting device is an EL light-emitting device and has an emission wavelength of 250 nm to 500 nm.

13. A method for manufacturing a phosphor represented by $M1_{(x1)}M2_{(x2)}M3_{(12)}(O,N)_{16}$, wherein M1 denotes one or more metal elements selected from the group consisting of Li, Mg, Ca, Sr, Ba, Y, La, Gd and Lu, M2 denotes one or more metal elements selected from the group consisting of Ce, Pr, Eu, Tb, Yb and Er, M3 denotes one or more metal elements selected from the group consisting of Si, Ge, Sn, B, Al, Ga and In, and x1 and x2 satisfy $0<x1$, $x2<2$ and $0<x1+x2<2$, which method comprises firing a raw material mixture of the phosphor in a non-oxidizing atmosphere at 1600 to 2200° C., wherein the raw material mixture has added thereto a target phosphor powder synthesized in advance as a seed.

14. A method for manufacturing an α-sialon-based phosphor containing at least one of Sr and Ba in an amount of 5 mass % or less, which method comprises firing a raw material mixture of the phosphor in a non-oxidizing atmosphere at 1600 to 2200° C., wherein the raw material mixture has added thereto a target phosphor powder synthesized in advance as a seed.

15. A method for manufacturing an α-sialon-based phosphor containing at least one of Sr and Ba in an amount of 5 mass % or less, which method comprises firing a raw material mixture of the phosphor in a non-oxidizing atmosphere at 1600 to 2200° C., wherein the raw material mixture is packed in advance in a crucible made of alumina, calcia, magnesia, graphite or boron nitride, and the raw material mixture is packed in advance in an amount of 20 volume % or more of the crucible.

* * * * *